(12) United States Patent
Garrity et al.

(10) Patent No.: US 7,064,700 B1
(45) Date of Patent: Jun. 20, 2006

(54) MULTI-CHANNEL ANALOG TO DIGITAL CONVERTER

(75) Inventors: Douglas A. Garrity, Gilbert, AZ (US); Brandt Braswell, Chandler, AZ (US); Thierry Cassagnes, Tournefeuille (FR); Christopher J. Cavanagh, Queen Creek, AZ (US); Mohammad Nizam U Kabir, Tempe, AZ (US); David R. LoCascio, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/154,405

(22) Filed: Jun. 15, 2005

(51) Int. Cl.
*H03M 1/12* (2006.01)

(52) U.S. Cl. ...................... 341/155; 341/161
(58) Field of Classification Search ................ 341/155, 341/159, 161, 122
See application file for complete search history.

(56) References Cited

U.S. PATENT DOCUMENTS

| | | | |
|---|---|---|---|
| 5,574,457 A | 11/1996 | Garrity et al. ............ 341/163 |
| 5,644,313 A | 7/1997 | Rakers et al. ............ 341/163 |
| 5,684,484 A * | 11/1997 | Suzuki .................... 341/155 |
| 6,362,770 B1 | 3/2002 | Miller et al. ............. 341/172 |
| 6,397,174 B1 * | 5/2002 | Poznanski et al. ......... 704/9 |
| 6,452,518 B1 * | 9/2002 | Kawabata ................ 341/118 |
| 6,535,157 B1 | 3/2003 | Garrity et al. ............ 341/172 |
| 6,594,217 B1 * | 7/2003 | Reed .................... 369/59.19 |
| 6,614,856 B1 * | 9/2003 | Meyer .................... 375/316 |
| 6,784,821 B1 * | 8/2004 | Lee ...................... 341/155 |
| 2001/0050624 A1 * | 12/2001 | Nagaraj .................. 341/155 |
| 2004/0203557 A1 * | 10/2004 | Zhang ................... 455/403 |

* cited by examiner

Primary Examiner—Peguy JeanPierre
(74) Attorney, Agent, or Firm—Ingrassia, Fisher &Lorenz (57) ABSTRACT

A pipelined analog to digital converter ("ADC") as described herein is capable of processing two or more input channels. The analog input voltages from the multiple channels are concurrently sampled (every other clock phase) using isolated input stages. The outputs of the input stages are concurrently sampled (every other clock phase) by a delay/holding and synchronization ("DHS") stage. The DHS stage processes the samples using a double sampling technique, generates residual voltage samples (every clock phase), and generates digital outputs for the multiple channels in an alternating manner. The DHS stage provides equal input loading for the input stages, which enhances the performance of the ADC.

23 Claims, 5 Drawing Sheets

MULTI-CHANNEL ANALOG TO DIGITAL CONVERTER

TECHNICAL FIELD

The present invention relates generally to electronic circuits. More particularly, the present invention relates to a pipelined analog to digital converter ("ADC").

BACKGROUND

The prior art is replete with ADC circuit designs and architectures. A pipelined ADC can be created by connecting a number of switched capacitor gain stages in series. The first gain stage receives the analog voltage to be converted and outputs a residual voltage for the second gain stage, the second gain stage receives the residual voltage and outputs another residual voltage for the third gain stage, and so on. Each gain stage amplifies its input voltage, then adds a positive voltage reference ($+V_{ref}$), a negative voltage reference ($-V_{ref}$), or zero, as determined by a comparison of the input voltage with two voltage thresholds ($V_H$ and $V_L$). Each gain stage also produces a digital output (i.e., a number of output bits) that is dependent on the threshold comparison process, and the digital outputs from the different gain stages are combined to produce the resultant digital conversion value.

In many practical applications there is a need to simultaneously convert two analog signals into their respective digital values, for example, in electronic systems that process in-phase ("I") and quadrature ("Q") signals. Such conversions may be accomplished through the use of two distinct ADCs, but at a considerable cost and power penalty. An alternate approach is to position two sample and hold circuits in front of a conventional ADC. The sample and hold circuits may simultaneously sample the two input values to be presented in an interleaved sequence to a single ADC for conversion. A drawback to this approach is that it introduces additional circuitry between the input signal and the ADC, which may add noise or systematic errors to the resultant digital value. Further, the buffer amplifiers, timing circuitry, and other circuitry required by the sample and hold circuits significantly increase the overall cost of the ADC.

Another approach for a pipelined ADC, which is disclosed in U.S. Pat. No. 6,362,770, employs an initial switched capacitance gain stage that receives two analog input signals for simultaneous sampling. The initial gain stage performs both a sample and hold function and a most significant bit extraction. Although the ADC disclosed in U.S. Pat. No. 6,362,770 is capable of simultaneously converting two separate input voltage signals, the configuration of the initial stage may not be suitable for all ADC applications, particularly those that require high precision, high channel isolation, and precise input channel matching.

Accordingly, it is desirable to have an improved ADC architecture that is capable of simultaneously converting the analog voltage from multiple input channels using a single pipelined ADC, thereby saving significant chip area and reducing power consumption relative to a conventional approach that employs a plurality of distinct ADC circuits. In addition, it is desirable to have a multi-channel ADC circuit that provides improved channel isolation, input channel load balancing, and increased accuracy relative to conventional multi-channel ADC techniques. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, clocks, digital logic elements, look-up tables, or the like, which may carry out a variety of functions under the control of one or more microprocessors or other control devices. In addition, those skilled in the art will appreciate that the present invention may be practiced in conjunction with any number of applications and that the ADC architectures described herein are merely example applications for the invention.

For the sake of brevity, conventional techniques related to switched capacitance gain stages, ADC architectures, voltage comparison circuits, digital logic circuits, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node/feature is directly or indirectly joined to (or is in direct or indirect communication with) another node/feature, and not necessarily physically. As used herein, unless expressly stated otherwise, "connected" means that one node/feature is directly joined to (or is in direct communication with) another node/feature. For example, a switch may be "coupled" to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

Figure 1:
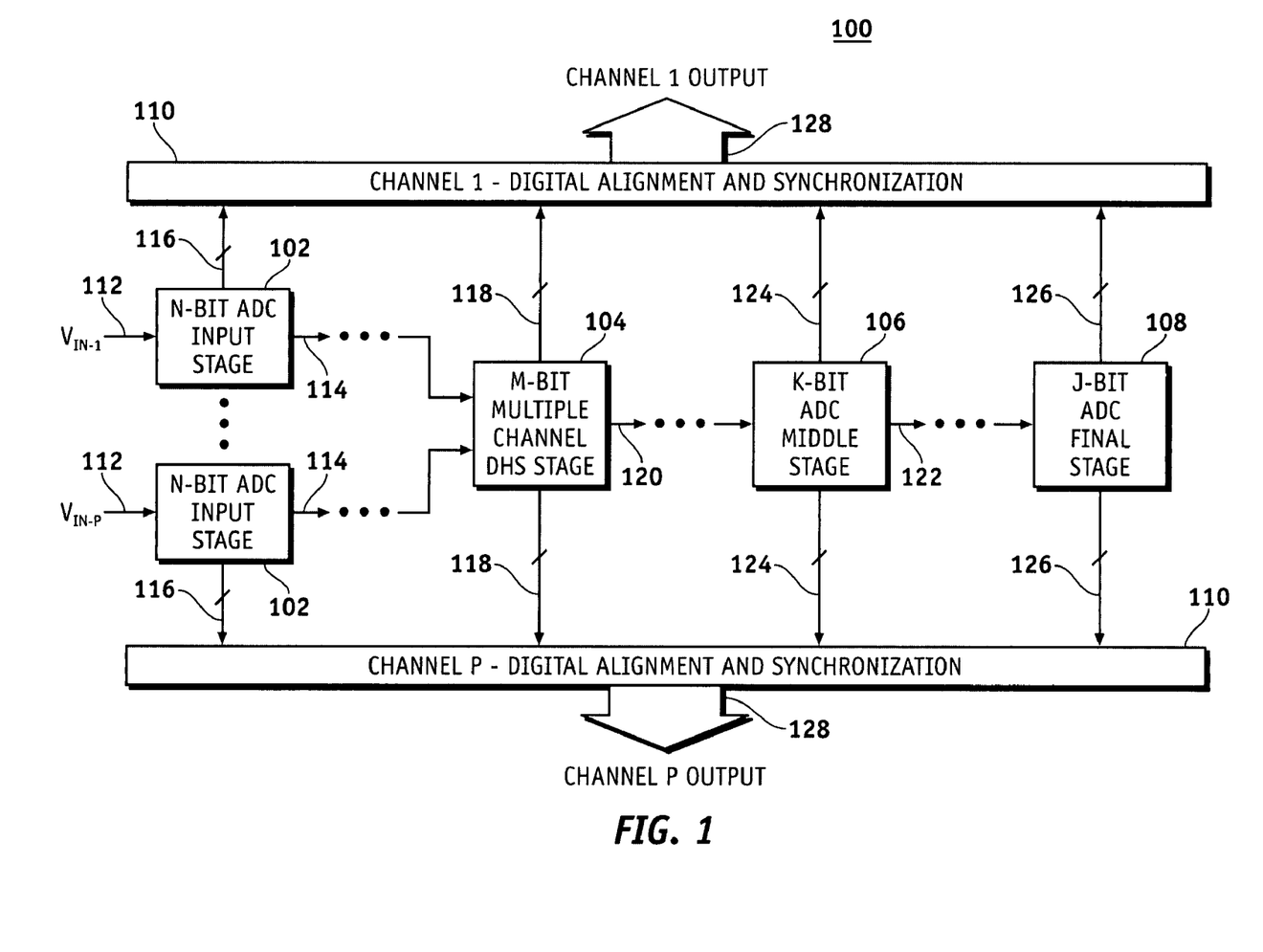
FIG. 1 is a schematic representation of a generalized pipelined ADC configured in accordance with an example embodiment of the invention.

FIG. 1 is a schematic representation of a generalized pipelined multi-channel ADC 100 configured in accordance with an example embodiment of the invention. ADC 100 generally includes a plurality of separate input stages 102, a delay/holding and synchronization ("DHS") stage 104 coupled to input stages 102, at least one middle stage 106 coupled to DHS stage 104, and a final stage 108 coupled to the last middle stage 106. ADC 100 may also include an architecture or arrangement 110 configured to perform digital alignment, synchronization, and/or correction for the multiple channels supported by ADC 100. FIG. 1 depicts ADC 100 in a generalized manner that is intended to represent the flexible nature of ADC 100. In this regard, ADC 100 may include any number (including zero) of separate input stages 102 that accommodate input voltage signals from up to P different channels. When no input stages 102 are utilized, DHS stage 104 serves as a "combined" first stage for the multiple channels. In addition, a given channel may utilize more than one input stage 102 in series, as indicated by the ellipses following the output of input stages 102. In other words, a given channel may include any number of input stages coupled in series before DHS stage 104. Similarly, although FIG. 1 depicts one middle stage 106, any number of middle stages (including zero) can be utilized in a practical embodiment. Furthermore, final stage 108 is optional and need not be utilized in all practical embodiments. Indeed, a simple embodiment of the invention can be realized with input stages 102 and DHS stage 104 alone, without any middle stages 106 and without final stage 108.

ADC 100 and the various stages of ADC 100 need not process any specific number of bits, and the bit resolution of ADC 100 and the various stages of ADC 100 can be selected to suit the needs of the particular application. For example, an input stage 102 is suitably configured to process its respective analog input voltage signal and to generate an N-bit output corresponding to that input voltage signal. In practice, N can be any number (including zero if an input stage 102 is realized as a sample and hold stage rather than an ADC stage) and the actual number need not be the same for all input stages 102. Thus, the input stage 102 for one channel might generate two output bits per sample, while the input stage 102 for another channel might generate four output bits per sample. Similarly, the number of bits (1 through M) and number of channels that are processed by DHS stage 104 can be adjusted as needed for the given application, and the actual number of bits in the digital output for each channel need not be the same. Likewise, the number of bits (1 through K) and the number of channels that are processed by any middle stage 106 can be adjusted as needed for the given application, and the actual number of bits in the digital output for each channel need not be the same. Finally, the number of bits (1 through J) and the number of channels that are processed by final stage 108 can be adjusted as needed for the given application, and the actual number of bits in the digital output for each channel need not be the same. Notably, the variables N, M, K, and J mentioned above need not be correlated in any way.

ADC 100 is suitably configured such that a plurality of input voltage signals 112 are simultaneously sampled with distinct input stages 102. Thereafter, one of the samples is delayed by DHS stage 104, which processes both samples in an alternating manner. DHS stage 104 merges the input channels together, delays the sample streams from the input channels relative to one other, and (in some embodiments) processes the residual voltages from the input channels in sequential fashion. The use of input stages 102 reduces the accuracy requirements of DHS stage 104, which enables the practical use of DHS stage 104 in applications that require high precision. The use of separate input stages 102 also provides improved isolation between the multiple channels. Furthermore, as described in more detail below, DHS stage 104 is suitably configured to provide a balanced load to input stages 102, which is desirable to preserve signal integrity.

In a practical embodiment, input stages 102 are configured to concurrently sample a plurality of input voltage signals 112 every other clock phase, and to concurrently provide a plurality of voltage sample sequences 114, where the plurality of voltage sample sequences 114 are derived from the plurality of input voltage signals 112. If an input stage 102 is realized as a sample-and-hold stage, then the voltage sample sequence 114 will correspond to the sampled input voltage signal 112 and input stage 102 will not generate a digital output. If an input stage 102 is realized as an ADC stage (for example, a switched capacitor gain stage), then the voltage sample sequence 114 will typically include samples having voltage levels that are different than the voltage levels of the corresponding samples from input voltage signal 112. An ADC stage will also generate an N-bit digital output 116 for each channel in response to the respective input voltage signal. As depicted in FIG. 1, the digital outputs 116 are processed by architecture 110 for contribution to the multi-channel output data.

DHS stage 104 is coupled to the respective outputs of input stages 102 to receive voltage sample sequences 114 (or suitable sample sequences that are based upon or derived from voltage sample sequences 114). DHS stage 104 concurrently samples voltage sample sequences 114 to obtain a plurality of DHS voltage sample sequences. The DHS voltage sample sequences correspond to, or are derived from, the respective voltage sample sequences 114. In practical embodiments, the DHS voltage sample sequences are internally obtained and processed by DHS stage 104. As described in more detail below, DHS stage 104 is suitably configured to alternately process the DHS voltage sample sequences using a double sampling technique. In the example embodiments described herein, DHS stage 104 performs double sampled processing relative to input stages 102. DHS stage 104 is also configured to generate a plurality of M-bit digital outputs 118 corresponding to voltage sample sequences 114. As depicted in FIG. 1, the digital outputs 118 are processed by architecture 110 for contribution to the multi-channel output data.

DHS stage 104 is structured to provide a series or sequence of interleaved DHS voltage samples 120, where the interleaved DHS voltage samples 120 are derived from the DHS voltage sample sequences processed by DHS stage 104. Notably, DHS stage 104 staggers the DHS voltage sample sequences to generate a single output sequence. In the example embodiments described herein, DHS stage 104 alternates between two DHS voltage sample sequences to produce one double sampled output sequence, e.g., interleaved DHS voltage samples 120.

A middle stage 106 may be coupled to the respective output of DHS stage 104 to receive interleaved DHS voltage samples 120 (or a suitable sample sequence that is based upon or derived from interleaved DHS voltage samples 120). Middle stage 106 is suitably configured to sample the series of interleaved DHS voltage samples 120 on every clock phase. In a practical embodiment, middle stage 106 can employ conventional techniques and/or known double sampled switched capacitor gain stage architectures. For example, one suitable architecture is disclosed in U.S. Pat. No. 5,574,457 (this patent is incorporated by reference herein). Middle stage 106 also generates and provides a series of interleaved residual voltage samples 122 at its output. The series of interleaved residual voltage samples 122 correspond to, or are derived from, the series of interleaved DHS voltage samples 120, and the interleaved residual voltage samples are output on every clock phase. Middle stage 106 is also configured to generate a plurality of K-bit digital outputs 124 corresponding to the series of interleaved DHS voltage samples 120. Notably, the digital outputs 124 for the different channels are generated in an alternating fashion. As depicted in FIG. 1, the digital outputs 124 are processed by architecture 110 for contribution to the multi-channel output data.

As mentioned above, a practical embodiment of ADC 100 may employ any number of middle stages 106 coupled in series, where each middle stage 106 generates a series of interleaved residual voltage samples 122 for the next stage in ADC 100. In some embodiments, ADC 100 includes final stage 108 coupled to the output of a middle stage 106. In embodiments having no middle stages 106, ADC 100 may include final stage 108 coupled to the output of DHS stage 104. Actually, final stage 108 is optional and need not be employed in all practical embodiments. Assuming that middle stage 106 is present, final stage 108 is coupled to receive interleaved residual voltage samples 122 (or a suitable sample sequence that is based upon or derived from interleaved residual voltage samples 122). Final stage 108 is suitably configured to sample, process, and convert the series of interleaved residual voltage samples 122. In a practical embodiment, final stage 108 can employ conventional sampling, comparison, and flash analog-to-digital conversion techniques to convert the series of interleaved residual voltage samples 122 to digital format while concurrently generating any remaining output bits as necessary. In this regard, final stage 108 samples the series of interleaved residual voltage samples 122 and generates a plurality of J-bit digital outputs 126 corresponding to the series of interleaved residual voltage samples 122. Notably, the digital outputs 126 for the different channels are generated in an alternating fashion. As depicted in FIG. 1, the digital outputs 126 are processed by architecture 110 for contribution to the multi-channel output data.

Architecture 110 is designed to align and synchronize the various digital outputs from the pipeline stages to provide proper timing of the ultimate channel output data 128. In addition, architecture 110 may be configured to perform digital correction, bit consolidation, and/or other digital processing of the various digital outputs prior to generating the channel output data 128. In this regard, architecture 110 may leverage conventional digital correction logic employed by known ADC circuits. One suitable correction architecture is disclosed in U.S. Pat. No. 5,644,313 (this patent is incorporated by reference herein).

Figure 2:
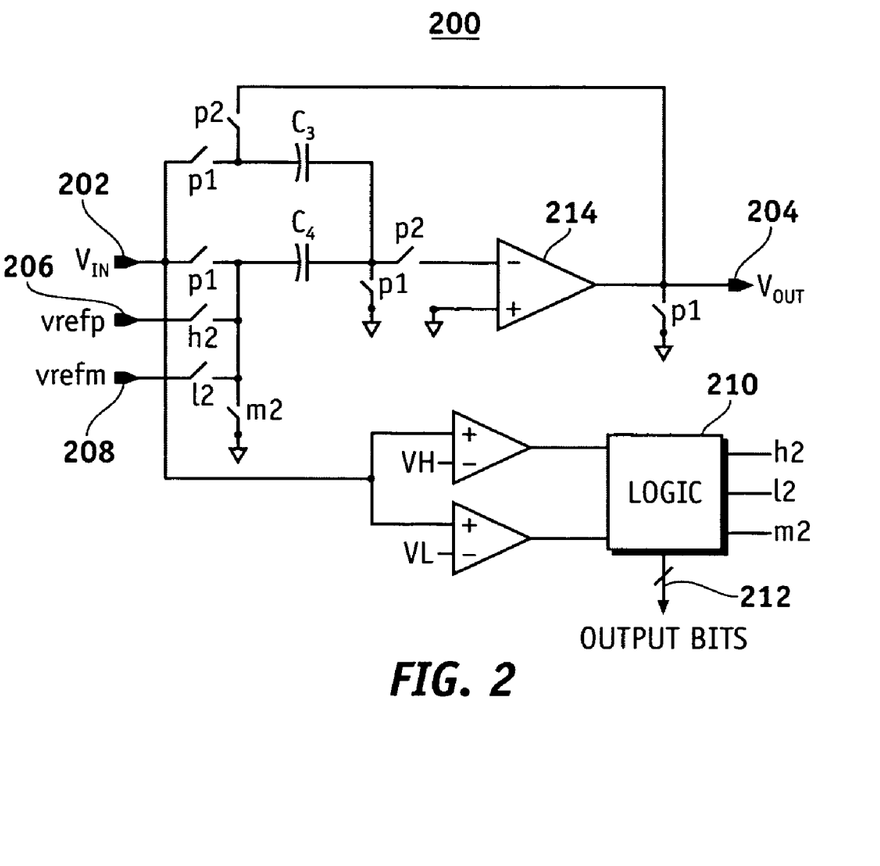
FIG. 2 is a schematic representation of an example ADC input stage that can be utilized in the pipelined ADC shown in FIG. 1.
Figure 3:
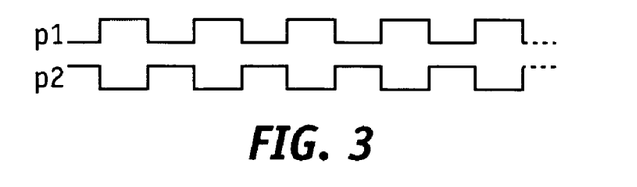
FIG. 3 is a diagram depicting the relative timing of example clock signals that influence the operation of the ADC input stage shown in FIG. 2.

In preferred embodiments, each input stage 102 may be configured as a standard ADC switched capacitor gain stage. For example, FIG. 2 is a schematic representation of one suitable ADC input stage 200 that can be utilized in ADC 100, and FIG. 3 is a diagram depicting the relative timing of example clock signals that influence the operation of ADC input stage 200. Although the simplified schematic shown in FIG. 2 (and in FIGS. 4, 6, and 8) is depicted in a single-ended configuration in order to simplify the explanation, a practical embodiment would be designed to be differential throughout ADC 100 in order to realize improved dynamic range and power supply rejection. ADC input stage 200 includes an input node 202 for receiving an input voltage signal, an output node 204 for providing a voltage sample sequence that is derived from the input voltage signal, a first reference node 206 for a first reference voltage $V_{REFP}$, and a second reference node 208 for a second reference voltage $V_{REFM}$. ADC input stage 200 also includes a digital logic component 210 that generates switch control signals and a digital output 212 (having zero to N bits in this example).

The operation of ADC input stage 200 is known to those skilled in the art and, therefore, will not be described in detail herein. Briefly, the switches in ADC input stage 200 are controlled by the clock signals depicted in FIG. 3 and by the switch control signals generated by digital logic component 210. The switches in FIG. 2 are labeled with their respective governing clock/control signals. In this example, when a clock/control signal is high, the associated switch is closed, and when a clock/control signal is low, the associated switch is open. Thus, when the p1 clock signal is high and the p2 clock signal is low, the $C_3$ and $C_4$ capacitors charge to sample the input voltage applied to input node 202. When the p1 clock signal is low and the p2 clock signal is high, the $C_3$ and $C_4$ capacitors are coupled to an amplifier 214, which generates an output voltage at output node 204. In addition, either the h2 switch, the l2 switch, or the m2 switch is closed depending upon the comparison of the input voltage present at input node 202 relative to a high voltage reference (VH) and a low voltage reference (VL). The result of the comparison also determines the bit values for digital output 212.

If the h2 switch is closed during the gain phase (i.e., when the p1 clock signal is low and the p2 clock signal is high), then $V_{REFP}$ is subtracted from the output voltage that would otherwise be generated at output node 204. If the l2 switch is closed during the gain phase, then $V_{REFM}$ is subtracted from the output voltage that would otherwise be generated at output node 204. If the m2 switch is closed during the gain phase, then only the $C_3$ and $C_4$ capacitors contribute to the output voltage at output node 204. In a typical ADC application, $V_{REFP}$ is a positive reference voltage ($+V_{REF}$), $V_{REFM}$ is a negative reference voltage ($-V_{REF}$) having the same magnitude as $+V_{REF}$, and the $C_3$ and $C_4$ capacitors have equal capacitance. Under those conditions, the output voltage at output node 204 will be twice the input voltage at input node 202 when the m2 switch is closed, and the output voltage will be modified by the addition or subtraction of $V_{REF}$ when the l2 or h2 switches are closed.

Figures 4, 5:
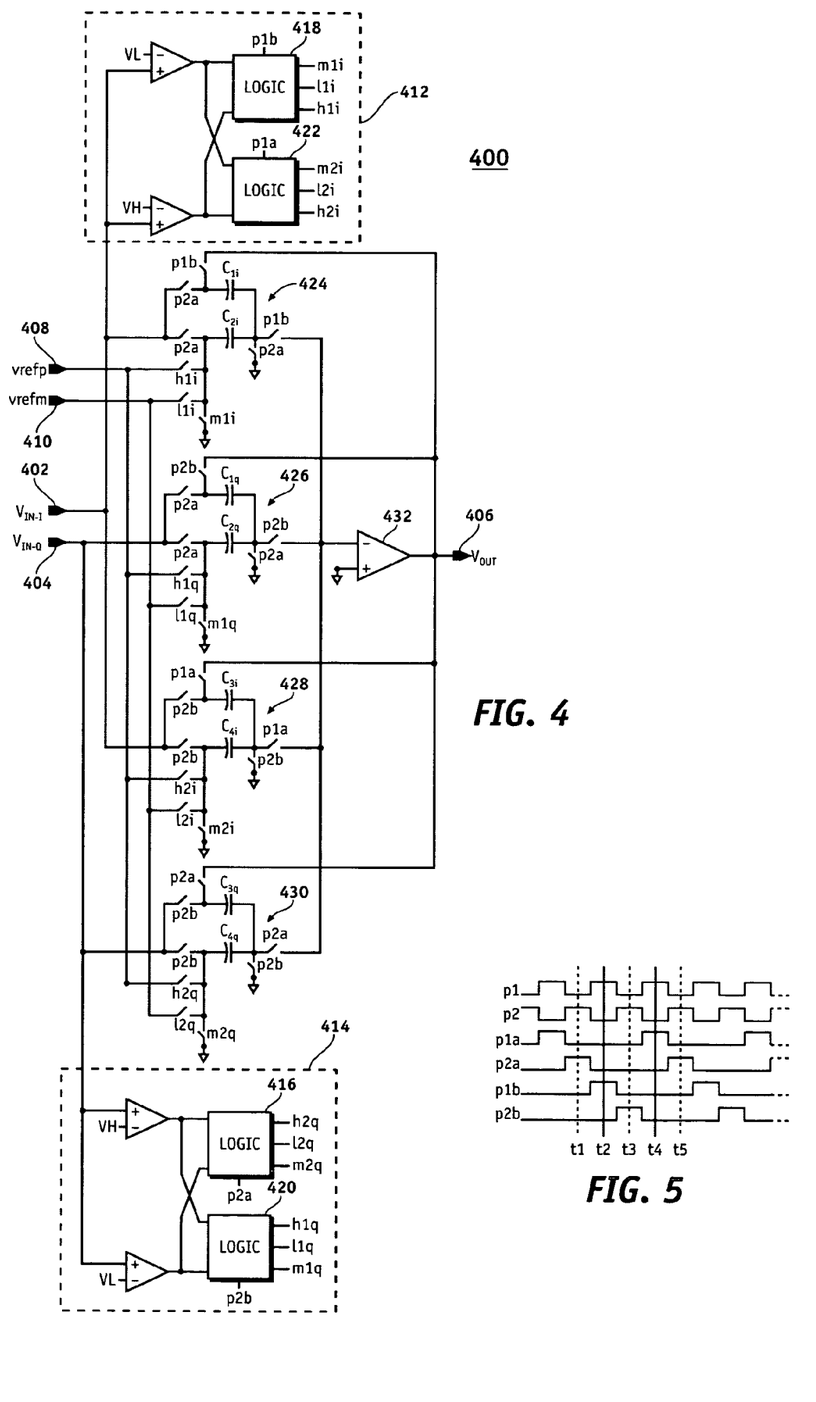
FIG. 4 is a schematic representation of an example delay/holding and synchronization ("DHS") ADC stage that can be utilized in the pipelined ADC shown in FIG. 1.
FIG. 5 is a diagram depicting the relative timing of example clock signals that influence the operation of the DHS ADC stage shown in FIG. 4.

As explained above, the output voltages of multiple input stages may be received by DHS stage 104 for combined processing. FIG. 4 is a schematic representation of an example DHS stage 400 that can be utilized in ADC 100, and FIG. 5 is a diagram depicting the relative timing of example clock signals that influence the operation of DHS stage 400. In this example, DHS stage 400 is configured to simultaneously sample two channel inputs, to delay the processing of one channel input, and to process the two channel inputs at a double sampling rate relative to the preceding input stages. In FIG. 5, the p1 and p2 clock signals correspond to the clock signals depicted in FIG. 3 and the remaining clock signals shown in FIG. 5 (p1a, p2a, p1b, and p2b) represent clock signals or clock phases that may be based upon or derived from the p1 and p2 clock signals. As described below, these remaining clock signals govern the operation of DHS stage 400 to facilitate double sampling by DHS stage 400.

DHS stage 400 includes an input node 402 for receiving a first input voltage signal (e.g., a series or sequence of voltage samples generated by a first ADC input stage), an input node 404 for receiving a second input voltage signal (e.g., a series or sequence of voltage samples generated by a second ADC input stage), and an output node 406 for providing an output voltage signal (e.g., a series or sequence of interleaved DHS voltage samples). Although the input voltage signals can be from any suitable source, this example identifies the input voltage signals as VIN_I and VIN_Q to represent a practical embodiment that processes corresponding in-phase and quadrature signals. The series of interleaved DHS voltage samples is derived from the first and second input voltage signals and, more particularly, is derived from the first and second DHS voltage sample sequences that are internally generated by DHS stage 400. DHS stage 400 also includes a first reference node 408 for a first reference voltage $V_{REFP}$, and a second reference node 410 for a second reference voltage $V_{REFM}$. DHS stage 400 also includes first comparison and digital logic architecture 412 and a second comparison and digital logic architecture 414, each being configured to generate respective switch control signals and a digital output (having one to M bits in this example) for the two channels. For the sake of simplicity, the digital outputs are not shown in FIG. 4.

The operation of DHS stage 400 will be summarized below with reference to the clock signals shown in FIG. 5. The switches in DHS stage 400 are controlled by the clock signals depicted in FIG. 5 and by the switch control signals generated by architectures 412/414. The switches in FIG. 4 are labeled with their respective governing clock/control signals. In this example, when a clock/control signal is high, the associated switch is closed, and when a clock/control signal is low, the associated switch is open. In FIG. 5, $t_1$ indicates the entire clock phase during which the p1 clock signal is low, the p2 clock signal is high, and the p2a clock signal is high. Likewise, the other time designators are intended to represent the respective clock phases (i.e., periods of time).

Beginning (arbitrarily) during time $t_1$, the p2 and p2a clock signals are high and the respective switches labeled p2 and p2a in FIG. 4 are closed. Concurrently, all remaining clock signals are low and all remaining switches are open. The logic high state of the p2a clock signal also enables a digital logic component 416 of architecture 414 (in contrast, the other digital logic components 418/420/422 remain disabled). The enabling of digital logic component 416 results in the generation of an appropriate switch control signal (h2q, l2q, or m2q) by digital logic component 416. During time $t_1$, a first switched capacitor arrangement 424 and a second switched capacitor arrangement 426 are controlled such that the $C_{1i}$ and the $C_{2i}$ capacitors charge to sample the VIN_I input voltage present at input node 402 and such that the $C_{1q}$ and the $C_{2q}$ capacitors charge to sample the VIN_Q input voltage present at input node 404. Also during time $t_1$, a fourth switched capacitor arrangement 430 is controlled such that the $C_{3q}$ and $C_{4q}$ capacitors are coupled to an amplifier 432, which generates an output voltage at output node 406. This output corresponds to a previously sampled VIN_Q input voltage stored by the $C_{3q}$ and $C_{4q}$ capacitors. In addition, since digital logic component 416 is enabled, either the h2q switch, the l2q switch, or the m2q switch is closed depending upon the comparison of the previously sampled VIN_Q input voltage relative to a high voltage reference (VH) and a low voltage reference (VL). The result of the comparison will impact the magnitude of the output voltage present at output node 406 in a manner similar to that described above for input stage 200. In this regard, comparison and digital logic architecture 414 may utilize suitable delay elements to ensure that the current output voltage sample temporally corresponds to its respective input voltage sample (which was obtained during a previous clock phase). The result of the comparison also determines the bit values for the current digital output generated by architecture 414. In this example, architecture 414 generates the M-bit digital output for the Q channel corresponding to the current sample.

During a subsequent time $t_2$, the p1 and p1b clock signals are high and the respective switches labeled p1 and p1b in FIG. 4 are closed. Concurrently, all remaining clock signals are low and all remaining switches are open. The logic high state of the p1b clock signal also enables a digital logic component 418 of architecture 412 (in contrast, the other digital logic components 416/420/422 remain disabled). The enabling of digital logic component 418 results in the generation of an appropriate switch control signal (h1i, l1i, or m1i) by digital logic component 418. During time $t_2$, the VIN_I and VIN_Q input voltage signals are not sampled. Rather, first switched capacitor arrangement 424 is controlled such that the $C_{1i}$ and $C_{2i}$ capacitors are coupled to amplifier 432 to generate an output voltage at output node 406 corresponding to the previously sampled VIN_I input voltage stored by the $C_{1i}$ and $C_{2i}$ capacitors. In addition, since digital logic component 418 is enabled, either the h1i switch, the l1i switch, or the m1i switch is closed depending upon the comparison of the previously sampled VIN_I input voltage relative to the VH and VL reference voltages. The result of the comparison will impact the magnitude of the output voltage present at output node 406 in a manner similar to that described above for input stage 200. In this regard, comparison and digital logic architecture 412 may utilize suitable delay elements to ensure that the current output voltage sample temporally corresponds to its respective input voltage sample (which, in this example, was obtained during the clock phase identified by $t_1$). The result of the comparison also determines the bit values for the current digital output generated by architecture 412. In this example, architecture 412 generates the M-bit digital output for the I channel corresponding to the current sample.

During a subsequent time $t_3$, the p2 and p2b clock signals are high and the respective switches labeled p2 and p2b in FIG. 4 are closed. Concurrently, all remaining clock signals are low and all remaining switches are open. The logic high state of the p2b clock signal also enables a digital logic component 420 of architecture 414 (in contrast, the other digital logic components 416/418/422 remain disabled). The enabling of digital logic component 420 results in the generation of an appropriate switch control signal (h1$q$, l1$q$, or m1$q$) by digital logic component 420. During time $t_3$, a third switched capacitor arrangement 428 and a fourth switched capacitor arrangement 430 are controlled such that the $C_{3i}$ and the $C_{4i}$ capacitors charge to sample the VIN_I input voltage present at input node 402 and such that the $C_{3q}$ and the $C_{4q}$ capacitors charge to sample the VIN_Q input voltage present at input node 404. Also during this time $t_3$, a second switched capacitor arrangement 426 is controlled such that the $C_{1q}$ and $C_{2q}$ capacitors are coupled to amplifier 432 to generate an output voltage at output node 406 corresponding to the previously sampled VIN_Q input voltage stored by the $C_{1q}$ and $C_{2q}$ capacitors. In addition, since digital logic component 420 is enabled, either the h1$q$ switch, the l1$q$ switch, or the m1$q$ switch is closed depending upon the comparison of the previously sampled VIN_Q input voltage relative to the VH and VL reference voltages. The result of the comparison will impact the magnitude of the output voltage present at output node 406 in a manner similar to that described above for input stage 200. In this regard, comparison and digital logic architecture 414 may utilize suitable delay elements to ensure that the current output voltage sample temporally corresponds to its respective input voltage sample (which, in this example, was obtained during the clock phase identified by $t_1$). The result of the comparison also determines the bit values for the current digital output generated by architecture 414. In this example, architecture 414 generates the M-bit digital output for the Q channel corresponding to the current sample.

During a subsequent time $t_4$, the p1 and p1$a$ clock signals are high and the respective switches labeled p1 and p1$a$ in FIG. 4 are closed. Concurrently, all remaining clock signals are low and all remaining switches are open. The logic high state of the p1$a$ clock signal also enables a digital logic component 422 of architecture 412 (in contrast, the other digital logic components 416/418/420 remain disabled). The enabling of digital logic component 422 results in the generation of an appropriate switch control signal (h2$i$, l2$i$, or m2$i$) by digital logic component 422. During time $t_4$, the VIN_I and VIN_Q input voltage signals are not sampled. Rather, third switched capacitor arrangement 428 is controlled such that the $C_{3i}$ and $C_{4i}$ capacitors are coupled to amplifier 432 to generate an output voltage at output node 406 corresponding to the previously sampled VIN_I input voltage stored by the $C_{3i}$ and $C_{4i}$ capacitors. In addition, since digital logic component 422 is enabled, either the h2$i$ switch, the l2$i$ switch, or the m2$i$ switch is closed depending upon the comparison of the previously sampled VIN_I input voltage relative to the VH and VL reference voltages. The result of the comparison will impact the magnitude of the output voltage present at output node 406 in a manner similar to that described above for input stage 200. In this regard, comparison and digital logic architecture 412 may utilize suitable delay elements to ensure that the current output voltage sample temporally corresponds to its respective input voltage sample (which, in this example, was obtained during the clock phase identified by $t_3$). The result of the comparison also determines the bit values for the current digital output generated by architecture 412. In this example, architecture 412 generates the M-bit digital output for the I channel corresponding to the current sample.

The clock phase identified by $t_5$ represents the beginning of another iteration of the procedure described above, i.e., the state of the clock signals during time $t_5$ is equivalent to the state of the clock signals during time $t_1$. Thus, the two input signals are again sampled while the output voltage will be based upon the voltages sampled by the $C_{3q}$ and $C_{4q}$ capacitors during time $t_3$. In the context of DHS stage 400, the two input voltage signals VIN_I and VIN_Q are concurrently sampled every other phase of the p2 clock signal. As used herein, the sampled input voltage sequences are referred to as DHS voltage sample sequences, which are internally produced and processed by DHS stage 400. In practice, the DHS voltage samples may be considered to be the voltages stored in the various capacitor arrangements described above. As described above, these DHS voltage samples are alternately processed to generate a series of interleaved DHS voltage samples at output node 406 on every clock phase (relative to the p1 clock signal or the p2 clock signal). In other words, although the two input voltage signals are concurrently sampled, processing of one of the two input channels is delayed to facilitate the generation of the double sampled output using only one amplifier 432. The digital outputs generated by architectures 412/414 are also alternately processed.

In an alternate embodiment, the comparators and digital logic components of DHS stage 400 can be configured to run at twice the normal clock rate (e.g., there could be two clock rates and the comparator clock rate would be twice as fast as the gain stage clock rates). In this alternate configuration, only one set of comparators and logic need be employed for DHS stage 400. One suitable technique that can be utilized in this context is disclosed in U.S. Pat. No. 6,535,157 (this patent is incorporated by reference herein).

Notably, DHS stage 400 provides an equal input load to each channel. In other words, assuming that all capacitances are equal, the load at input node 402 and the load at input node 404 are balanced at all times. As is well known in the art, balanced loads and capacitances may be critical to differential circuits and may lead to greatly improved rejection of interference and noise from the power supply and switching noise from the silicon substrate in an integrated circuit since the noise and interfering signals appear as common-mode signals which are rejected by the differential circuits.

Figure 6:
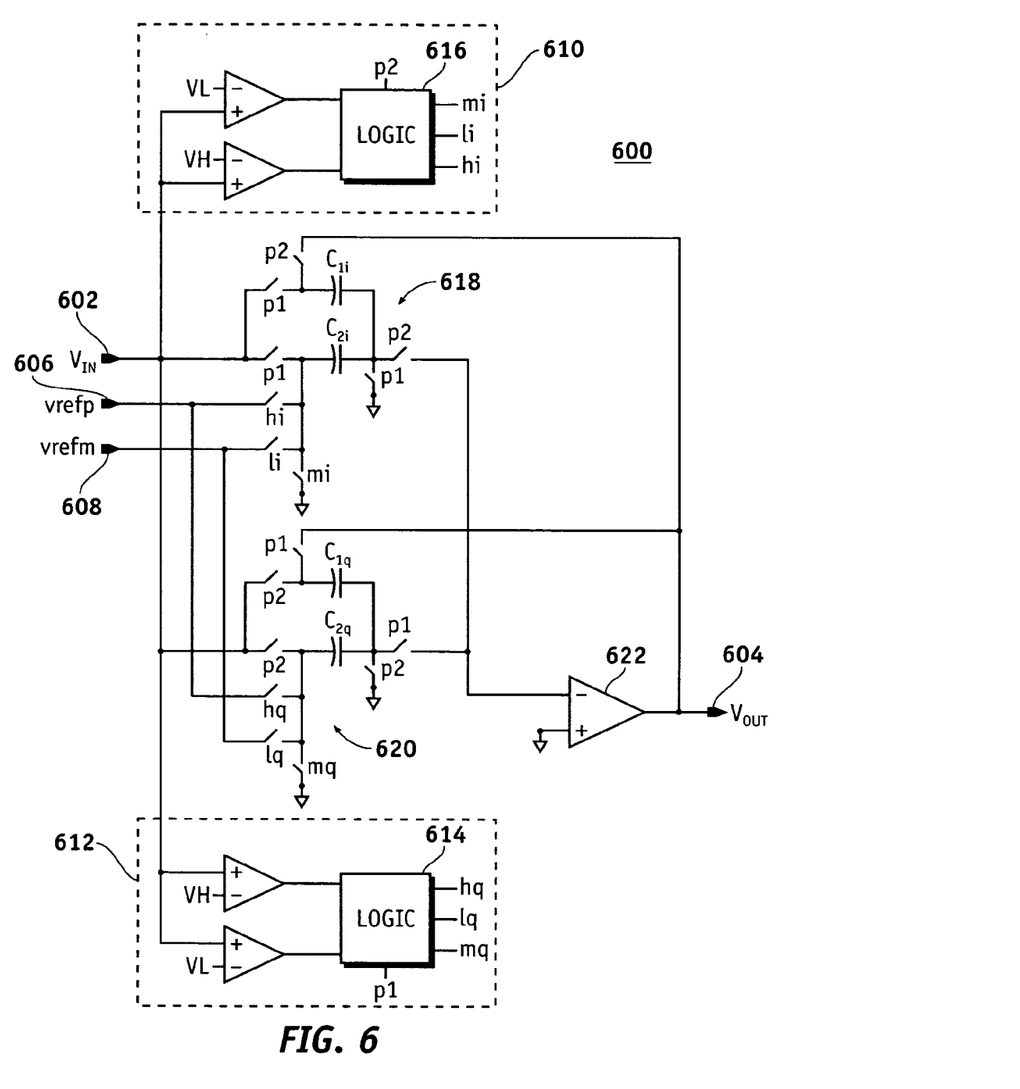
FIG. 6 is a schematic representation of an example middle ADC stage that can be utilized in the pipelined ADC shown in FIG. 1.
Figure 7:
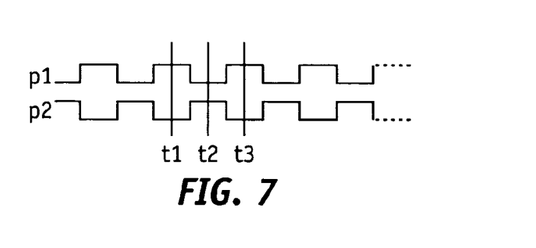
FIG. 7 is a diagram depicting the relative timing of example clock signals that influence the operation of the middle ADC stage shown in FIG. 6.

As described above in connection with ADC 100, the series of interleaved DHS voltage samples generated by DHS stage 104 may be received by a middle stage 106 for double sampled processing. FIG. 6 is a schematic representation of an example middle stage 600 that can be utilized in ADC 100, and FIG. 7 is a diagram depicting the relative timing of example clock signals that influence the operation of middle stage 600. In this example, middle stage 600 is configured to sample its input on every clock phase (the p1 and p2 clock signals), generate a series of interleaved residual voltage samples in response to the input samples, and process digital outputs for the two channels (the two channel outputs are generated in an alternating fashion). In FIG. 5, the p1 and p2 clock signals correspond to the clock signals depicted in FIG. 3 and FIG. 5.

Middle stage 600 includes an input node 602 for receiving an input voltage signal (e.g., a series or sequence of interleaved DHS voltage samples generated by DHS stage 104), and an output node 604 for providing an output voltage signal (e.g., a series or sequence of interleaved residual voltage samples). The series of interleaved residual voltage samples is derived from the input voltage signal for middle stage 600. Middle stage 600 also includes a first reference node 606 for a first reference voltage $V_{REFP}$, and a second reference node 608 for a second reference voltage $V_{REFM}$. Middle stage 600 also includes a first comparison and digital logic architecture 610 and a second comparison and digital logic architecture 612, each being configured to generate respective switch control signals and a digital output (having one to K bits in this example) for the two channels. For the sake of simplicity, the digital outputs are not shown in FIG. 6.

Middle stage 600 may be configured in accordance with the switched capacitor gain stage disclosed in U.S. Pat. No. 5,574,457 (this patent is incorporated by reference herein). The operation of middle stage 600 will be summarized below with reference to the clock signals shown in FIG. 7. The switches in middle stage 600 are controlled by the clock signals depicted in FIG. 7 and by the switch control signals generated by architectures 610/612. The switches in FIG. 6 are labeled with their respective governing clock/control signals. In this example, when a clock/control signal is high, the associated switch is closed, and when a clock/control signal is low, the associated switch is open.

Beginning (arbitrarily) during a time $t_1$, the p1 clock signal is high and the p2 clock signal is low. Thus, the switches labeled p1 are closed and the switches labeled p2 are open. The logic high state of the p1 clock signal also enables a digital logic component 614 of architecture 612 (in contrast, a digital logic component 616 of architecture 610 remains disabled). The enabling of digital logic component 614 results in the generation of an appropriate switch control signal (hq, lq, or mq) by digital logic component 614. During time $t_1$, a first switched capacitor arrangement 618 is controlled such that the $C_{1i}$ and the $C_{2i}$ capacitors charge to sample the input voltage present at input node 602. Also during time $t_1$, a second switched capacitor arrangement 620 is controlled such that the $C_{1q}$ and $C_{2q}$ capacitors are coupled to an amplifier 622, which generates an output voltage at output node 604. This output corresponds to a previously sampled input voltage stored by the $C_{1q}$ and $C_{2q}$ capacitors. In addition, since digital logic component 614 is enabled, either the hq switch, the lq switch, or the mq switch is closed depending upon the comparison of the previously sampled input voltage relative to a high voltage reference (VH) and a low voltage reference (VL). The result of the comparison will impact the magnitude of the output voltage present at output node 604 in a manner similar to that described above for input stage 200. In this regard, comparison and digital logic architecture 612 may utilize suitable delay elements to ensure that the current output voltage sample temporally corresponds to its respective input voltage sample (which was obtained during a clock phase prior to the clock phase identified by $t_1$). The result of the comparison also determines the bit values for the current digital output generated by architecture 612. In this example, architecture 612 generates the K-bit digital output for the Q channel corresponding to the current sample.

During a subsequent time $t_2$, the p1 clock signal is low and the p2 clock signal is high. Thus, the switches labeled p1 are now open and the switches labeled p2 are now closed. The logic high state of the p2 clock signal also enables digital logic component 616 of architecture 610 (in contrast, digital logic component 614 remains disabled). The enabling of digital logic component 616 results in the generation of an appropriate switch control signal (hi, li, or mi) by digital logic component 616. During time $t_2$, second switched capacitor arrangement 620 is controlled such that the $C_{1q}$ and the $C_{2q}$ capacitors charge to sample the input voltage present at input node 602. Also during time $t_2$, second switched capacitor arrangement 618 is controlled such that the $C_{1i}$ and $C_{2i}$ capacitors are coupled to amplifier 622 to generate an output voltage at output node 604 corresponding to the previously sampled input voltage stored by the $C_{1i}$ and $C_{2i}$ capacitors. In addition, since digital logic component 616 is enabled, either the hi switch, the li switch, or the mi switch is closed depending upon the comparison of the previously sampled input voltage relative to the VH and VL voltage references. The result of the comparison will impact the magnitude of the output voltage present at output node 604 in a manner similar to that described above for input stage 200. In this regard, comparison and digital logic architecture 610 may utilize suitable delay elements to ensure that the current output voltage sample temporally corresponds to its respective input voltage sample (which was obtained during time $t_1$). The result of the comparison also determines the bit values for the current digital output generated by architecture 610. In this example, architecture 610 generates the K-bit digital output for the I channel corresponding to the current sample.

The clock phase identified by $t_3$ represents the beginning of another iteration of the procedure described above, i.e., the state of the clock signals during time $t_3$ is equivalent to the state of the clock signals during time $t_1$. Thus, the input signal is again sampled while the output voltage will be based upon the voltages sampled by the $C_{1q}$ and $C_{2q}$ capacitors during time $t_1$. In the context of middle stage 600, the input voltage signal is sampled (and the output series of interleaved residual voltage samples is generated) on every clock phase. Furthermore, the digital outputs generated by architectures 610/612 are alternately processed (although the digital output for each channel is produced every other clock phase).

In an alternate embodiment, the comparators and digital logic components of middle stage 600 can be configured to run at twice the normal clock rate (e.g., there could be two clock rates and the comparator clock rate would be twice as fast as the gain stage clock rates). In this alternate configuration, only one set of comparators and logic need be employed for middle stage 600. As mentioned above in connection with DHS stage 400, a suitable technique that can be utilized in this context is disclosed in U.S. Pat. No. 6,535,157.

Figure 8:
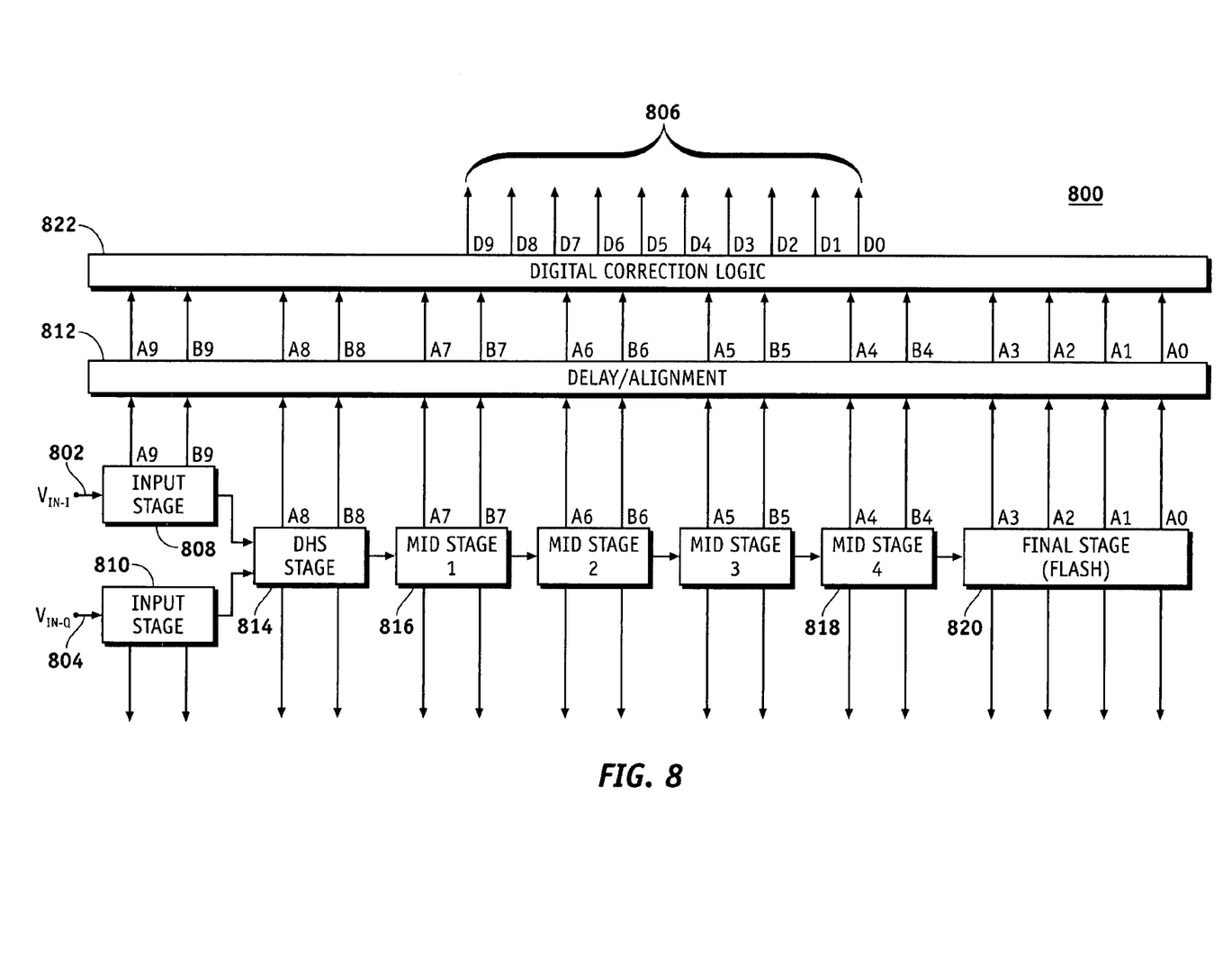
FIG. 8 is a schematic representation of a two-channel pipelined ADC configured in accordance with an example embodiment of the invention.

The generalized arrangement shown in FIG. 1 can be utilized in a number of practical applications. In this regard, FIG. 8 is a schematic representation of a two-channel pipelined ADC 800 configured in accordance with an example embodiment of the invention. In this example, the two channels represent an in-phase input channel and a quadrature input channel. For the sake of brevity and simplicity, FIG. 8 only shows the elements of ADC 800 associated with the handling of the in-phase input channel. In practice, ADC 800 will include equivalent elements associated with the quadrature input channel.

ADC 800 generally includes a first input node 802 for receiving a first analog input voltage signal (VIN_I), a second input node 804 for receiving a second analog input voltage signal (VIN_Q), and a number of output nodes 806 for generating a 10-bit digital output for the in-phase channel. The two input signals are concurrently sampled every other clock phase, and the 10-bit digital output for each channel is generated every other clock phase.

ADC 800 includes a first input stage 808 for the in-phase channel and a second input stage 810 for the quadrature channel. Input stages 808/810 concurrently sample their respective input voltage signals and concurrently generate their respective output voltage signals. As shown in FIG. 8, input stage 808 is suitably configured to generate a 2-bit digital output, which is routed to a delay/alignment architecture 812. The outputs of the two input stages 808/810 are coupled to respective inputs of a DHS stage 814. As described above, DHS stage 814 concurrently samples the outputs generated by input stages 808/810, but alternately processes the samples and generates its output voltage samples using double sampling techniques. DHS stage 814 is suitably configured to generate a 2-bit digital output for the in-phase channel (which is routed to delay/alignment architecture 812), and a 2-bit digital output for the quadrature channel.

The output of DHS stage 814 is coupled to an input of a first middle stage 816. In this example, ADC 800 employs four middle stages coupled in series, and each middle stage is suitably configured to generate a 2-bit digital output for the in-phase channel (which is routed to delay/alignment architecture 812), and a 2-bit digital output for the quadrature channel. Each middle stage samples its input voltage signal during every clock phase and generates its output voltage signal during every clock phase.

The output of a fourth middle stage 818 is coupled to an input of a final flash stage 820. Final flash stage 820 processes the residual voltage from fourth middle stage 818 and generates a 4-bit digital output for the in-phase channel (this 4-bit digital output is routed to delay/alignment architecture 812). Ultimately, delay/alignment architecture 812 receives sixteen input bits from input stage 808, DHS stage 814, the middle stages, and final flash stage 820. In a practical embodiment of ADC 800, delay/alignment architecture 812 includes a number of delay elements, such as flip-flops, that are suitably controlled to temporally align the sixteen input bits for synchronized presentation to digital correction logic 822. As mentioned above, digital correction logic 822 may be suitably configured to perform digital correction, bit consolidation, and/or other digital processing of the sixteen bits. In this example, digital correction logic 822 consolidates the number of bits from sixteen to ten and generates the resulting 10-bit digital output corresponding to a sampled analog input voltage.

In summary, systems, devices, and methods configured in accordance with example embodiments of the invention relate to:

A multi-channel ADC comprising a plurality of input stages configured to concurrently sample a plurality of input voltage signals, and to concurrently provide a plurality of voltage sample sequences, the plurality of voltage sample sequences being derived from the plurality of input voltage signals, and a DHS stage coupled to the plurality of input stages, the DHS stage being configured to concurrently sample the plurality of voltage sample sequences to obtain a plurality of DHS voltage sample sequences, and to alternately process the plurality of DHS voltage sample sequences. The plurality of input stages may comprise a plurality of sample-and-hold stages. The plurality of input stages may comprise a plurality of N-bit ADC stages. Each of the plurality of N-bit ADC stages may be configured to generate N output bits corresponding to a respective one of the plurality of input voltage signals. The plurality of input stages may comprise a plurality of switched capacitor gain stages. The DHS stage may be configured to generate a plurality of digital outputs corresponding to the plurality of voltage sample sequences. The DHS stage may be configured to generate a first digital output corresponding to a first input stage, and to generate a second digital output corresponding to a second input stage. The plurality of input voltage signals may comprise an in-phase signal and a corresponding quadrature signal. The DHS stage may be configured to provide a series of interleaved DHS voltage samples derived from the plurality of DHS voltage sample sequences. The multi-channel ADC may further comprise at least one middle stage coupled to an output of the DHS stage, the at least one middle stage being configured to sample and process the series of interleaved DHS voltage samples. The at least one middle stage may be configured to generate a plurality of digital outputs corresponding to the series of interleaved DHS voltage samples. The at least one middle stage may be configured to provide a series of interleaved residual voltage samples, and the multi-channel ADC may further comprise a final stage coupled to an output of the at least one middle stage, the final stage being configured to sample and process the series of interleaved residual voltage samples. The final stage may be configured to generate a plurality of digital outputs corresponding to the series of interleaved residual voltage samples. The multi-channel ADC may further comprise a final stage coupled to an output of the DHS stage, the final stage being configured to sample and process the series of interleaved DHS voltage samples. The final stage may be configured to generate a plurality of digital outputs corresponding to the series of interleaved DHS voltage samples.

A multi-channel ADC comprising a first ADC input stage configured to sample a first input voltage signal, and to generate a first voltage sample sequence derived from the first input voltage signal, a second ADC input stage configured to sample a second input voltage signal, and to generate a second voltage sample sequence derived from the second input voltage signal, and a DHS stage coupled to the first input stage and coupled to the second input stage, the DHS stage being configured to concurrently sample the first voltage sample sequence and the second voltage sample sequence to obtain a first DHS voltage sample sequence and a second DHS voltage sample sequence, and to alternately process the first DHS voltage sample sequence and the second DHS voltage sample sequence. The DHS stage may be configured to provide a series of interleaved DHS voltage samples derived from the first DHS voltage sample sequence and the second DHS voltage sample sequence. The multi-channel ADC may further comprise at least one middle stage coupled to an output of the DHS stage, the at least one middle stage being configured to sample and process the series of interleaved DHS voltage samples. The first input voltage signal may comprise an in-phase signal, and the second input voltage signal may comprise a quadrature signal corresponding to the in-phase signal. The at least one middle stage may be configured to provide a series of interleaved residual voltage samples, and the multi-channel ADC may further comprise a final stage coupled to an output of the at least one middle stage, the final stage being configured to sample and process the series of interleaved residual voltage samples.

An analog to digital conversion method comprising sampling a first input voltage signal with a first ADC stage, generating, with the first ADC stage, a first voltage sample sequence in response to the first input voltage signal, sampling a second input voltage signal with a second ADC stage, generating, with the second ADC stage, a second voltage sample sequence in response to the second input voltage signal, concurrently sampling the first voltage sample sequence and the second voltage sample sequence to respectively obtain a first delayed voltage sample sequence and a second delayed voltage sample sequence, and alternately processing the first delayed voltage sample sequence and the second delayed voltage sample sequence. The method may further comprise generating, with the first ADC stage, a first N-bit digital output in response to the first input voltage signal, and generating, with the second ADC stage, a second N-bit digital output in response to the second input voltage signal. The method may further comprise generating a first M-bit digital output in response to the first voltage sample sequence, and generating a second M-bit digital output in response to the second voltage sample sequence. The method may further comprise generating a series of interleaved voltage samples in response to the first delayed voltage sample sequence and the second delayed voltage sample sequence. The method may further comprise sampling and processing the series of interleaved voltage samples. The first input voltage signal may comprise an in-phase signal, and the second input voltage signal may comprise a quadrature signal corresponding to the in-phase signal.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A multi-channel analog to digital converter ("ADC") comprising:
   a plurality of input stages configured to concurrently sample a plurality of input voltage signals, and to concurrently provide a plurality of voltage sample sequences, said plurality of voltage sample sequences being derived from said plurality of input voltage signals; and
   a delay/holding and synchronization ("DHS") stage coupled to said plurality of input stages, said DHS stage being configured to concurrently sample said plurality of voltage sample sequences to obtain a plurality of DHS voltage sample sequences, and to alternately process said plurality of DHS voltage sample sequences.

2. A multi-channel ADC according to claim 1, said plurality of input stages comprising a plurality of N-bit ADC stages.

3. A multi-channel ADC according to claim 1, said DHS stage being configured to generate a plurality of digital outputs corresponding to said plurality of voltage sample sequences.

4. A multi-channel ADC according to claim 1, said DHS stage being configured to generate a first digital output corresponding to a first one of said plurality of input stages, and to generate a second digital output corresponding to a second one of said plurality of input stages.

5. A multi-channel ADC according to claim 1, said plurality of input voltage signals comprising an in-phase signal and a corresponding quadrature signal.

6. A multi-channel ADC according to claim 1, said DHS stage being configured to provide a series of interleaved DHS voltage samples derived from said plurality of DHS voltage sample sequences.

7. A multi-channel ADC according to claim 6, further comprising at least one middle stage coupled to an output of said DHS stage, said at least one middle stage being configured to sample and process said series of interleaved DHS voltage samples.

8. A multi-channel ADC according to claim 7, said at least one middle stage being configured to generate a plurality of digital outputs corresponding to said series of interleaved DHS voltage samples.

9. A multi-channel ADC according to claim 7, said at least one middle stage being configured to provide a series of interleaved residual voltage samples, and said multi-channel ADC further comprising a final stage coupled to an output of said at least one middle stage, said final stage being configured to sample and process said series of interleaved residual voltage samples.

10. A multi-channel ADC according to claim 9, said final stage being configured to generate a plurality of digital outputs corresponding to said series of interleaved residual voltage samples.

11. A multi-channel ADC according to claim 6, further comprising a final stage coupled to an output of said DHS stage, said final stage being configured to sample and process said series of interleaved DHS voltage samples.

12. A multi-channel ADC according to claim 11, said final stage being configured to generate a plurality of digital outputs corresponding to said series of interleaved DHS voltage samples.

13. A multi-channel analog to digital converter ("ADC") comprising:
   a first ADC input stage configured to sample a first input voltage signal, and to generate a first voltage sample sequence derived from said first input voltage signal;
   a second ADC input stage configured to sample a second input voltage signal, and to generate a second voltage sample sequence derived from said second input voltage signal; and
   a delay/holding and synchronization ("DHS") stage coupled to said first input stage and coupled to said second input stage, said DHS stage being configured to concurrently sample said first voltage sample sequence and said second voltage sample sequence to obtain a first DHS voltage sample sequence and a second DHS voltage sample sequence, and to alternately process said first DHS voltage sample sequence and said second DHS voltage sample sequence.

14. A multi-channel ADC according to claim 13, said DHS stage being configured to provide a series of interleaved DHS voltage samples derived from said first DHS voltage sample sequence and said second DHS voltage sample sequence.

15. A multi-channel ADC according to claim 14, further comprising at least one middle stage coupled to an output of said DHS stage, said at least one middle stage being configured to sample and process said series of interleaved DHS voltage samples.

16. A multi-channel ADC according to claim 15, said at least one middle stage being configured to provide a series of interleaved residual voltage samples, and said multi-channel ADC further comprising a final stage coupled to an output of said at least one middle stage, said final stage being configured to sample and process said series of interleaved residual voltage samples.

17. A multi-channel ADC according to claim 13, said first input voltage signal comprising an in-phase signal, and said second input voltage signal comprising a quadrature signal corresponding to said in-phase signal.

18. An analog to digital conversion method comprising:

sampling a first input voltage signal with a first analog to digital converter ("ADC") stage;

generating, with said first ADC stage, a first voltage sample sequence in response to said first input voltage signal;

sampling a second input voltage signal with a second ADC stage;

generating, with said second ADC stage, a second voltage sample sequence in response to said second input voltage signal;

concurrently sampling said first voltage sample sequence and said second voltage sample sequence to respectively obtain a first delayed voltage sample sequence and a second delayed voltage sample sequence; and alternately processing said first delayed voltage sample sequence and said second delayed voltage sample sequence.

19. A method according to claim 18, further comprising:

generating, with said first ADC stage, a first N-bit digital output in response to said first input voltage signal; and generating, with said second ADC stage, a second N-bit digital output in response to said second input voltage signal.

20. A method according to claim 18, further comprising:

generating a first M-bit digital output in response to said first voltage sample sequence; and generating a second M-bit digital output in response to said second voltage sample sequence.

21. A method according to claim 18, further comprising generating a series of interleaved voltage samples in response to said first delayed voltage sample sequence and said second delayed voltage sample sequence.

22. A method according to claim 21, further comprising sampling and processing said series of interleaved voltage samples.

23. A method according to claim 18, said first input voltage signal comprising an in-phase signal, and said second input voltage signal comprising a quadrature signal corresponding to said in-phase signal.

* * * * *